(12) United States Patent
Iida et al.

(10) Patent No.: US 7,134,882 B2
(45) Date of Patent: Nov. 14, 2006

(54) CONNECTOR HAVING A BUILT-IN ELECTRONIC PART

(75) Inventors: Mitsuru Iida, Hisai (JP); Mitsutaka Abe, Nishinomiya (JP); Hidetaka Mori, Tsu (JP)

(73) Assignee: Matsushita Electric Works, Ltd., Osaka (JP)

( * ) Notice: Subject to any disclaimer, the term of this patent is extended or adjusted under 35 U.S.C. 154(b) by 0 days.

(21) Appl. No.: 10/541,038

(22) PCT Filed: Aug. 24, 2004

(86) PCT No.: PCT/JP2004/012106

§ 371 (c)(1),
(2), (4) Date: Jun. 28, 2005

(87) PCT Pub. No.: WO2005/020385

PCT Pub. Date: Mar. 3, 2005

(65) Prior Publication Data

US 2006/0183358 A1     Aug. 17, 2006

(30) Foreign Application Priority Data

Aug. 26, 2003   (JP)   ............... 2003-301913

(51) Int. Cl.
  *H01R 12/00*  (2006.01)
(52) U.S. Cl. .......................... 439/74; 439/70
(58) Field of Classification Search .................. 439/74, 439/75, 66–70; 361/760; 257/704
See application file for complete search history.

(56) References Cited

U.S. PATENT DOCUMENTS 4,490,001 A * 12/1984 Gordon et al. ................. 439/68
5,355,282 A * 10/1994 Yokemura et al. ........... 361/760
5,433,617 A *  7/1995 Morlion et al. .............. 439/108
5,588,847 A * 12/1996 Tate ............................... 439/71
5,599,208 A     2/1997 Ward ............................ 439/620

(Continued)

FOREIGN PATENT DOCUMENTS

JP         60-59379          4/1985

(Continued)

OTHER PUBLICATIONS

English Language Abstract of JP 2002-198132.

(Continued)

*Primary Examiner*—Michael C. Zarroli
(74) *Attorney, Agent, or Firm*—Greenblum & Bernstein, P.L.C.

(57) ABSTRACT

In a connector with a component built-in, a base member is formed of three-dimensional formation circuit substrate, and has a fitting portion that is to be fitted to a connector of counterpart. Terminals electrically connected to a wiring pattern on a mother board, contacts electrically connected to contacts of the connector of counterpart, and a conductive pattern electrically connected to the electronic component are formed on a surface of the base member. Thus, the conductive pattern can easily be modified depending on application, and it is possible to provide complicated wirings. Furthermore, since the electronic component is mounted on the base member, it is possible to make the connector embed a lot of electronic components, and degrees of freedom of design are increased. Still furthermore, the electronic component can be connected by reflow soldering, so that mounting workability of the electronic component is increased.

8 Claims, 9 Drawing Sheets

U.S. PATENT DOCUMENTS

| | | | |
|---|---|---|---|
| 5,915,975 A * | 6/1999 | McGrath | 439/74 |
| 6,019,613 A * | 2/2000 | Kataoka et al. | 439/83 |
| 6,575,769 B1 | 6/2003 | Takeuchi et al. | 439/74 |
| 6,623,308 B1 * | 9/2003 | Ono | 439/680 |
| 6,905,344 B1 * | 6/2005 | Nishio et al. | 439/68 |
| 2002/0055283 A1 | 5/2002 | Yoon et al. | 439/66 |
| 2003/0068907 A1 * | 4/2003 | Morte et al. | 439/70 |
| 2004/0023528 A1 * | 2/2004 | Nishio et al. | 439/70 |

FOREIGN PATENT DOCUMENTS

| | | | |
|---|---|---|---|
| JP | 3-49178 | * | 3/1991 |
| JP | 8-236219 | | 9/1996 |
| JP | 9-232014 | | 9/1997 |
| JP | 2000-260506 | | 9/2000 |
| JP | 2002-042979 | | 2/2002 |
| JP | 2001-184532 | | 6/2002 |
| JP | 2002-184532 | | 6/2002 |
| JP | 2002-198108 | | 7/2002 |
| JP | 2002-198132 | | 7/2002 |

OTHER PUBLICATIONS

English Language Abstract of JP 2001-184532.
English Language Abstract of JP 8-236219.
English Language Abstract of JP 2000-260506.
English Language Abstract of JP 2002-198108.
English Language Abstract of JP 60-59379.
English Language Abstract of JP 2002-042979.
English Language Abstract of JP 9-232014.

* cited by examiner

CONNECTOR HAVING A BUILT-IN ELECTRONIC PART

TECHNICAL FIELD

The present invention relates to a connector with an electronic component built-in.

BACKGROUND ART

In a mid flow of electric wiring to electronic equipments, electronic components such as a capacitor, a resistor, a diode are used for purpose in total. As a method to simplify the electric wiring, the connector which has an electronic component built-in is suggested conventionally.

FIG. 9A shows a configuration of a conventional connector with an electric component built-in, which is, for example shown in Japanese Laid-Open Patent Publication No. 2002-198132. In this conventional connector, a capacitor 101 is used as an electronic component, and two lead terminals 104a and 104b of the capacitor 101 are respectively soldered to a conductor 102 of a cable and an inner conductor terminal 103 of a connector, so that the conductor 102 and the inner conductor terminal 103 are electrically connected via the capacitor 101. The capacitor 101, conductor 102 and the inner conductor terminal 103 are insulated by an insulating material 105 and an outside conductor terminal 106.

In addition, FIG. 9B shows a configuration of another conventional connector with an electronic component built-in, for example, shown in Japanese Laid-Open Patent Publication No. 2002-184532. In this another conventional connector, electrodes 112a and 112b provided on both ends of a chip type electronic component 111 are respectively soldered to a rear end portion 113a of a fitting terminal 113 and a rear end portion 114a of a connecting terminal 114, so that the integrated chip type electronic component 111, the fitting terminal 113 and the connecting terminal 114 are fixed on a connector housing 115.

As mentioned above, it is difficult to perform a mounting operation of the electronic component in an inside of the connector by the conventional method for soldering the electronic component to the metal terminals or a conductor such as the cable. Therefore, modifications of the circuit structure and the conductive pattern cannot be performed easily, so that it is difficult to correspond to purpose alteration. In addition, it is difficult to put complicated electric wiring for a connector interior, and it is difficult to let connector have a lot of electronic components built-in. Furthermore, since a plurality of members is necessary for protecting the electronic component, a mounting operation of the component is complicated.

DISCLOSURE OF INVENTION

The present invention is made to solve the problems of the above-mentioned prior arts, and the object of the invention is to provide a connector which can make a modification of a conductive pattern of a connector easily, and can realize the increase of degrees of freedom of design of electric wiring and enhancement of mounting workability of an electronic component.

For achieving the above-mentioned object, a connector with an electronic component built-in in accordance with an aspect of the present invention comprises: a base member formed of a three-dimensional formation circuit board; terminals formed on said base member and electrically connected to wiring pattern of a mother board; a fitting portion formed on said base member, and to be fitted to a counterpart connector; contacts arranged on said fitting portion and to be electrically connected with contacting terminal portions of said counterpart connector; an electric component disposed on said base member; and a conductive pattern formed on said base member for electrically connecting said terminals or said contacts with said electronic component.

According to such a configuration, since the conductive pattern, the terminals and the contacts are formed on the base member of the three-dimensional formation circuit board, it is relatively easy to modify the conductive pattern depending on application. Furthermore, since the superficial area of the base member of the three-dimensional formation circuit board is relatively larger, it is possible to form a complicated electric wiring, so that it is possible to built-in a lot of electronic components in the connector. As a result, degrees of freedom of design of electric wiring can be increased. Still furthermore, since the electronic component is disposed on the base member of the three-dimensional formation circuit board, it is possible to connect the electronic component by reflow soldering, so that the mounting workability of the electronic component is increased.

BRIEF DESCRIPTION OF DRAWINGS

FIG. 9A is a sectional view showing a configuration of a conventional connector with an electronic component built-in, and FIG. 9B is a perspective view showing a configuration of another conventional connector with an electronic component built-in.

BEST MODE FOR CARRYING OUT THE INVENTION

Figure 1:
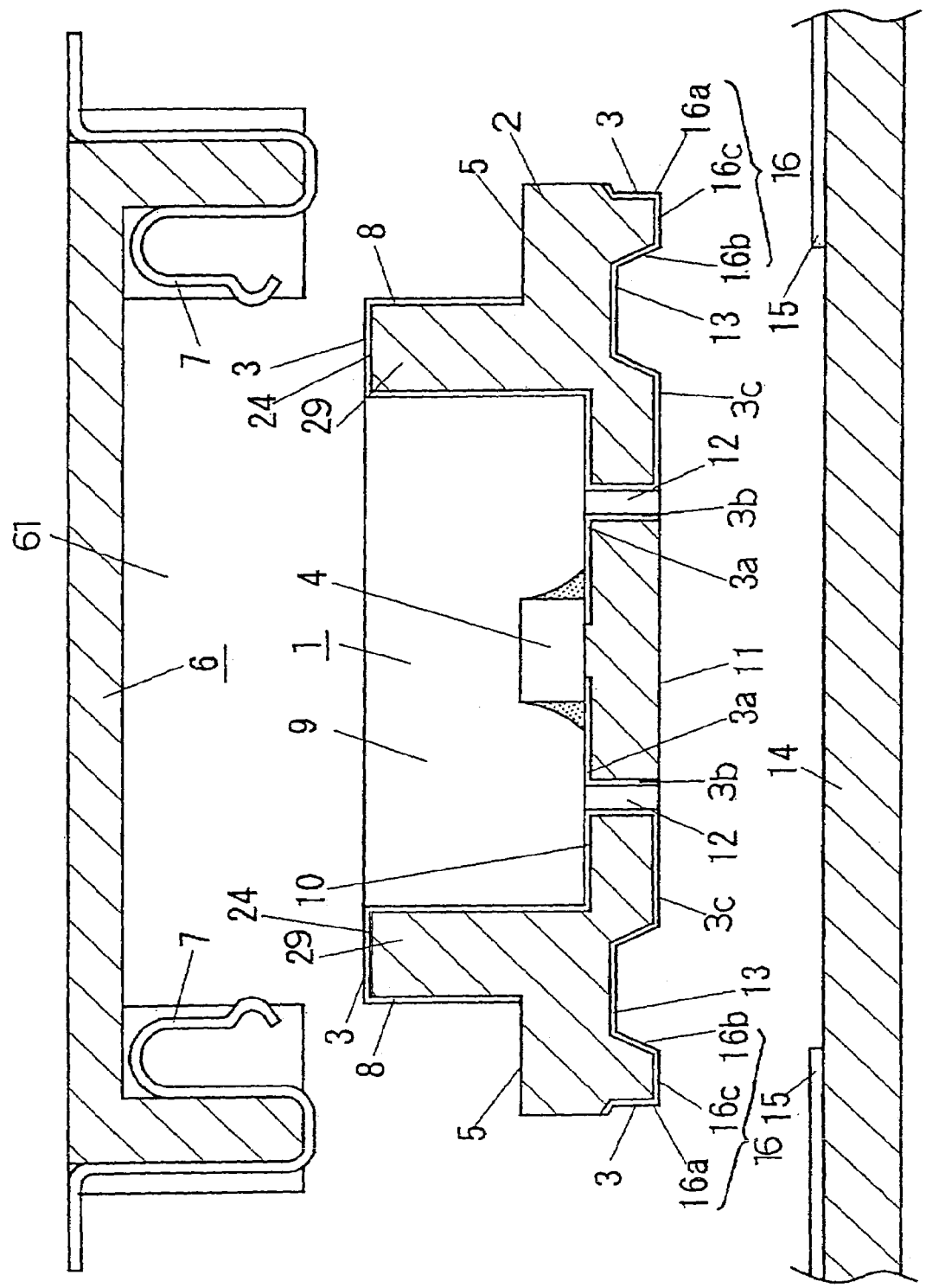
FIG. 1 is a sectional view showing a configuration of a connector with an electronic component built-in in accordance with a first embodiment of the present invention.

A connector with an electronic component built-in in accordance with a first embodiment of the present invention is described in detail with reference to drawing. FIG. 1 is a sectional view showing a configuration of the connector in accordance with the first embodiment. As shown in FIG. 1, the connector in accordance with the first embodiment is comprised of a header 1 and a socket 6, and an electronic component 4 is built-in to the header 1. In addition, FIG. 2 is a perspective view showing a configuration of the header 1.

Figure 2:
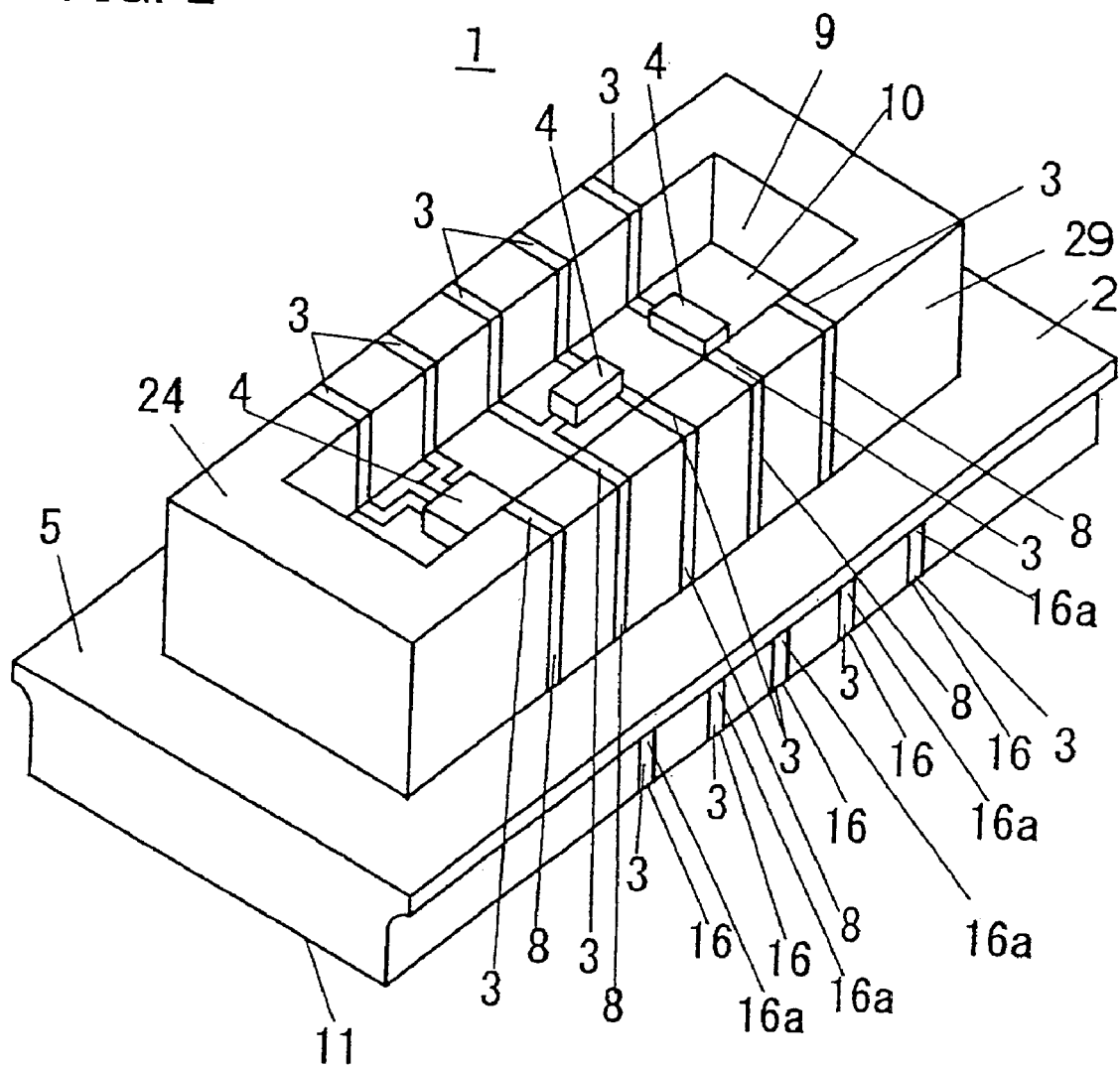
FIG. 2 is a perspective view showing a configuration of a header of the connector in accordance with the first embodiment.

As can be seen from FIG. 1 and FIG. 2, the header 1 comprises a base member 2 of a three-dimensional formation circuit board which is formed of, for example, thermosetting resin, ceramics, or the like, a conductive pattern 3 formed on the base member 2, an electronic component 4 mounted on the base member 2, and so on.

The base member 2 has a rectangular plane portion 5 and a fitting portion 29 formed on a center of the plane portion 5. The fitting portion 29 has a substantially rectangular parallelepiped shape, and it is to be fitted to a concavity 61 formed to the socket 6 which is a counterpart. In the center of the fitting portion 29, a concavity 9 of rectangular parallelepiped shape having a depth measure that is long than a height measure of the fitting portion 29 from the plane portion 5 is formed. On a bottom face 10 of the concavity 9, the electronic component 4 is mounted by soldering, so that it is electrically connected to a conductive pattern 3a. In addition, in the concavity 9, a plurality of through holes 12 is formed for penetrating from the bottom face 10 of the concavity 9 to a back face portion 11 of the base member 2. A pair of groove portions 13 is formed on the back face portion 11 along longitudinal direction of the base member 2.

Terminals 16, which are to be soldered to a wiring pattern 15 of a mother board 14 when the base member 2 is fixed on the mother board 14, are formed with a conductive pattern 3 on both end portions in width direction of the back face portion 11 of the base member 2. Furthermore, contacts 8, which are to be electrically connected to contact terminal portions 7 of the socket 6 as the counterpart connector, are integrally formed with the conductive pattern 3 along outer side faces of the fitting portion 29.

Each terminal 16 has a parallel face 16c parallel to the wiring pattern 15 of the mother board 14 at a center portion thereof, and an outer inclined face (including perpendicularity) 16a and an inner inclined face 16b at both end portion thereof which are not parallel to the wiring pattern 15 of the mother board 14. Fillets of solder are formed on the inclined faces 16a and 16b, so that the terminal 16 is electrically connected to the wiring pattern 15 of the mother board 14. A conductive pattern 3b is formed along an inner peripheral surface of each through hole 12, so that the conductive pattern 3a on the bottom face 10 of the concavity 9 and the conductive pattern 3c on the back face portion 11 are electrically connected, and the contacts 8 and the terminals 16 are electrically connected through electronic component 4.

Figure 3:
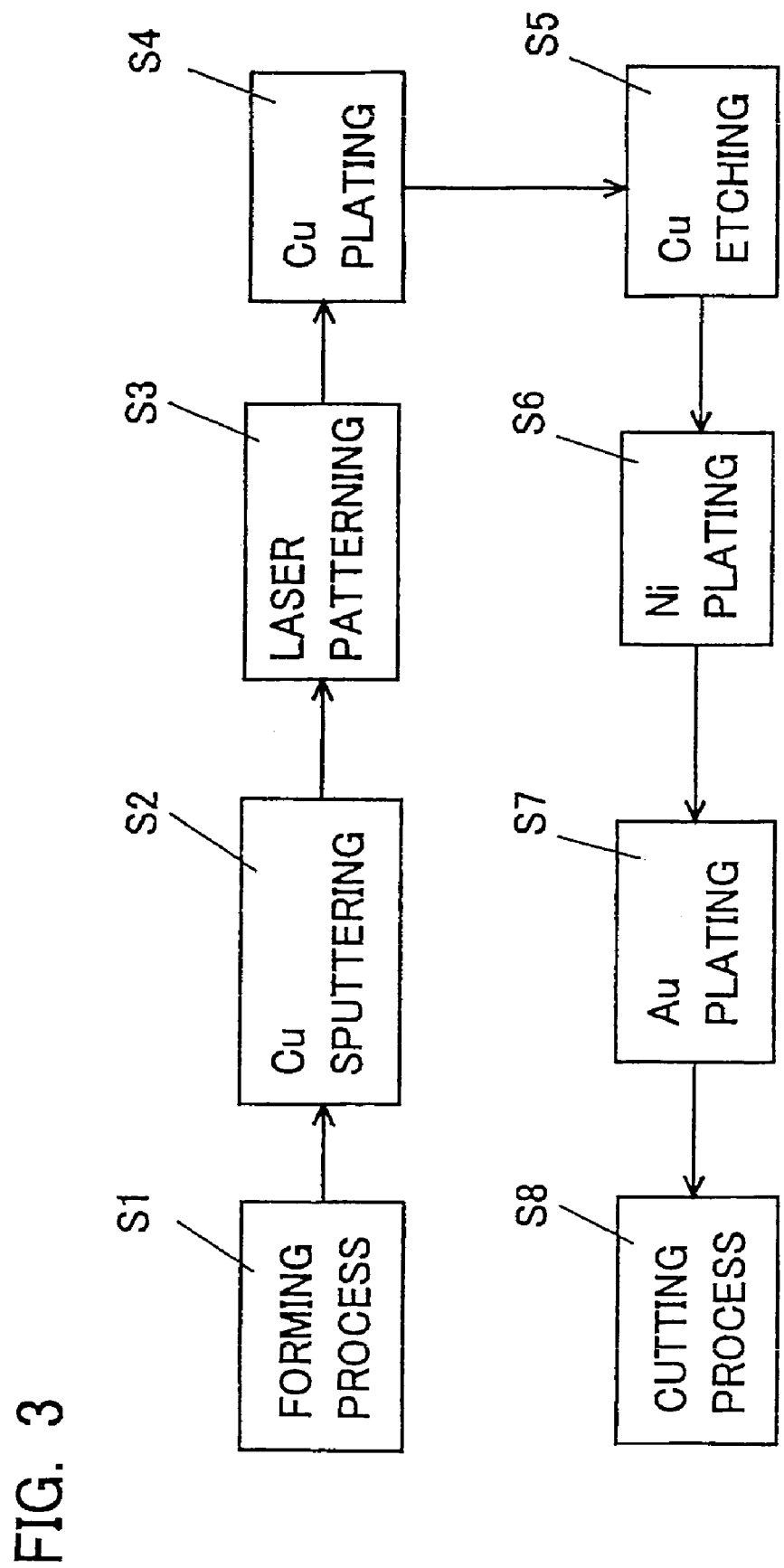
FIG. 3 is a flowchart showing manufacturing processes of a base member of the connector (or the header) by electrolytic plating in accordance with the first embodiment.
Figure 4:
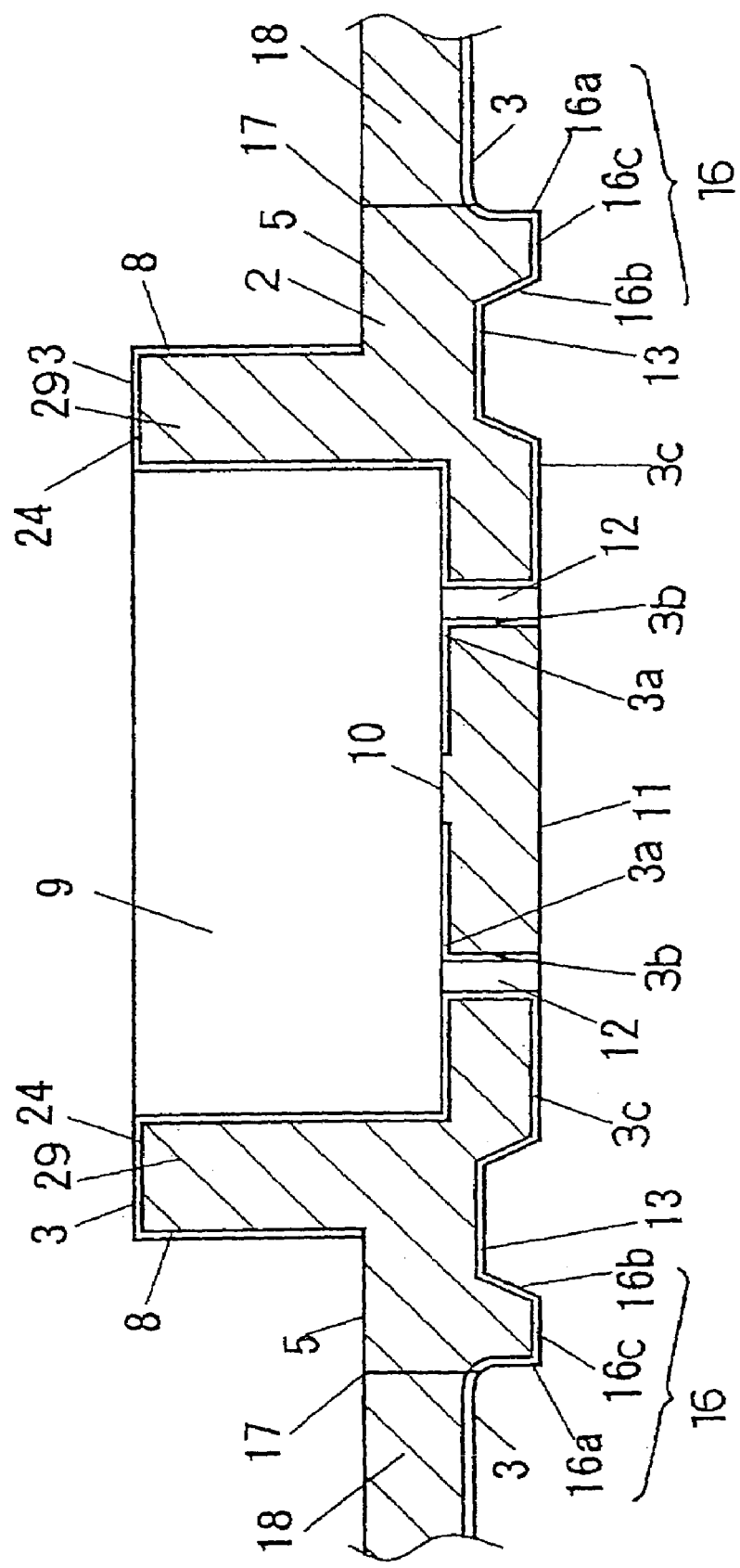
FIG. 4 is a sectional view showing a configuration of a base member just before implementation by above manufacturing process.

Subsequently, manufacturing process of the base member 2 is described with reference to FIG. 3 and FIG. 4. FIG. 3 is a flowchart showing the manufacturing process of the base member 2, and FIG. 4 is a sectional view showing a configuration of the base member 2 just before implementation.

At first, a base substance of three-dimensional formation circuit board is molded (S1). Subsequently, a Cu film is formed by sputtering technique to cover the entire surface of the base substance (S2), and a Cu film is patterned by using a laser beam (S3). Furthermore, electrolytic plating of Cu is performed on only a part which it is necessary (S4), and Cu of unnecessary portion is removed by etching (S5). After that, electrolytic plating of Ni is performed to the base substance (S6), and electrolytic plating of Au is performed thereto (S7). Finally, as shown in FIG. 4, the base member 2 and the feeding side 18 of plating current are cut off in disconnecting portion 17 on the plane portion 5 (S8). The base member 2 comprised of the three-dimensional formation circuit board on which conductive pattern 3 is formed is finished.

Since the base member 2 of three-dimensional formation circuit board is manufactured by the above-mentioned processes, the contacts 8 and the terminals 16 are integrally formed with the conductive pattern 3 on the base member 2. Therefore, the contacts 8, the terminals 16 and the conductive pattern 3 can easily be modified depending on purpose. Furthermore, since a superficial area of the base member 2 of the three-dimensional formation circuit board is relatively larger, complicated electric wiring can be formed, and a lot of electronic components 4 can be mounted on the base member 2. As a result, degrees of freedom of design can be increased. Still furthermore, since the electronic component 4 is disposed on the bottom face 10 of the concavity 9 of base member 2, namely, on a plane portion, reflow soldering can be used for soldering of the electronic component 4, mounting workability of the electronic component 4 is improved, and yield of manufacture can be increased.

Figure 5:
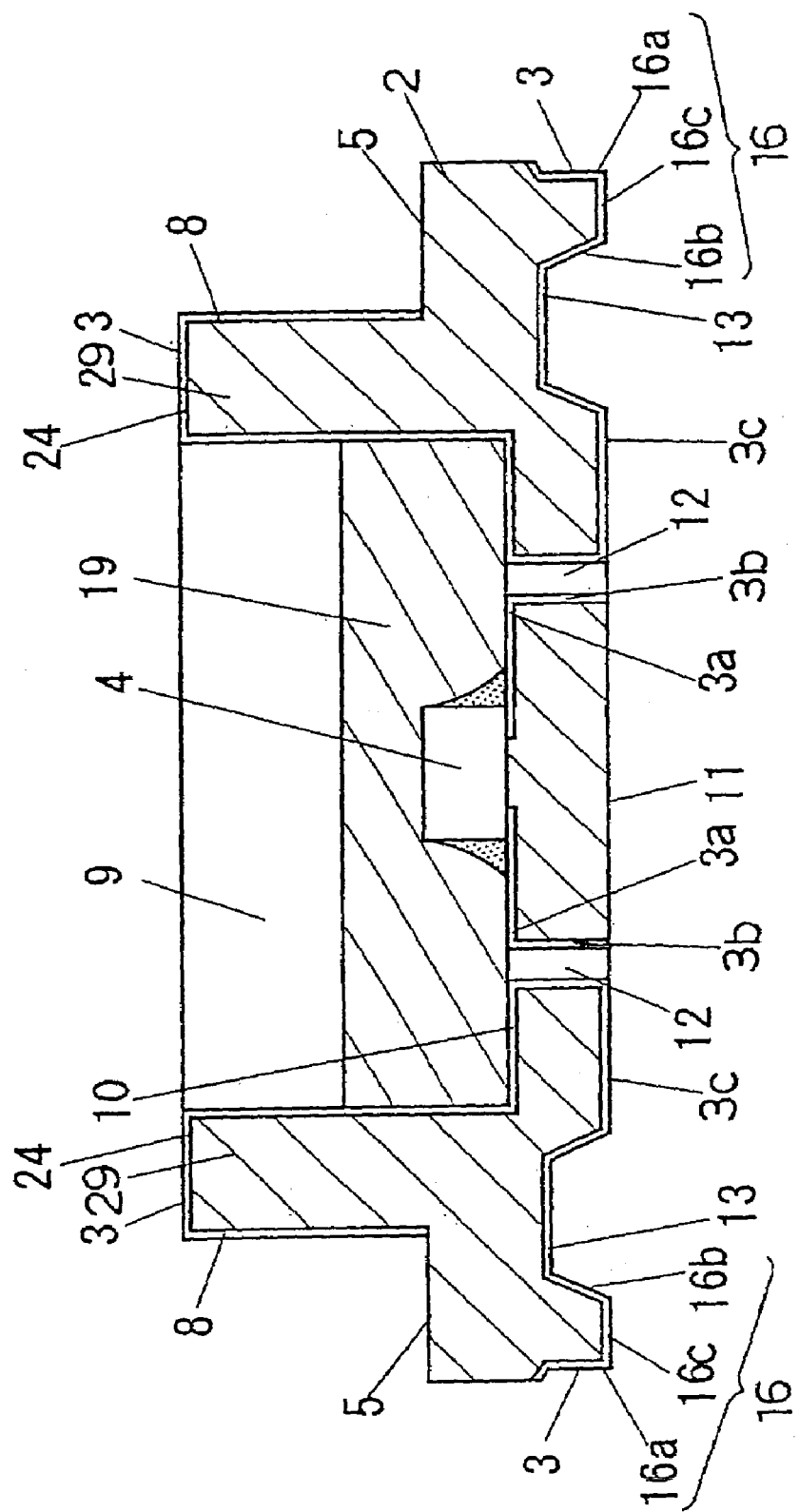
FIG. 5 is a sectional view showing a configuration of a modification of the connector in accordance with the first embodiment.

Subsequently, a configuration of a modification of the connector in accordance with the first embodiment is shown in FIG. 5. As shown in FIG. 5, it is possible that a sealant 19 is filled in the cavity 9 so as to cover and seal the electronic component 4. With respect to the other structure, it is similar to the above-mentioned case, so that the description of it is omitted. In this way, even though a number of steps of the manufacturing processes is increased and it causes the increase of the cost a little by covering and sealing the electronic component 4, it is possible to protect the electronic component 4 further to the above-mentioned effects. The same goes for in the following embodiments.

Figure 6:
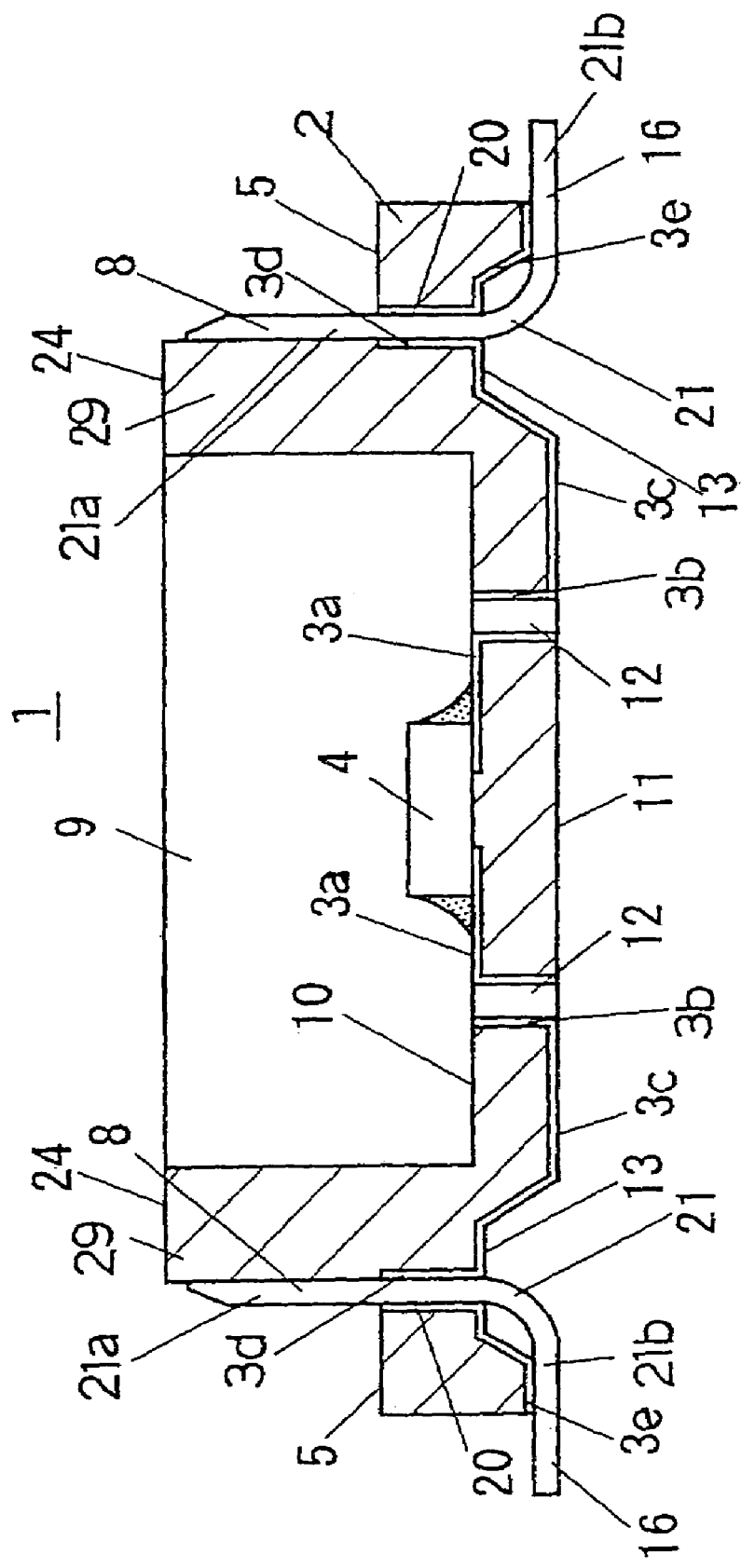
FIG. 6 is a sectional view showing a configuration of a connector with an electronic component built-in in accordance with a second embodiment of the present invention.

Subsequently, a connector with an electronic component built-in in accordance with a second embodiment of the present invention is described in detail with reference to figures. FIG. 6 is a sectional view showing a configuration of a header of a connector in accordance with the second embodiment.

As shown in FIG. 6, holding apertures 20 each for holding a contact terminal 21 of metal are formed penetrating through the pale portion 5 and the groove portions 13 of the base member 2 and along outer side faces of the fitting portion 29, in the second embodiment. Conductive patterns 3d are formed on inner peripheral surfaces of the holding apertures 20. The contact terminal 21 has a substantially L-shaped section, and a longitudinal side portion 21a serves as a contact 8, and a transversal side portion 21b serves as a terminal 16.

The contact terminal 21 is press fitted into the holding aperture 20 in a manner so that the longitudinal side portion 21a is directed upward from the back face side of the base member 2 under a condition that a front end of the transversal side portion 21b is directed outward. In other words, the direction of press fitting of the contact terminal 21 to the holding aperture 20 of the base member 2 is set to be perpendicular to the direction of press contact of the contact terminal portion 7 of the socket 6 as the counter part connector (see FIG. 7). In addition, a portion among the longitudinal side portion 21a press fitted into the holding aperture 20 serves as a portion to be held.

By such a configuration, the longitudinal side portion 21a of the contact terminal 21 serving as a contact 8 goes along an outer side face of the fitting portion 29, and a lower end of the longitudinal side portion 21b is electrically connected to the conductive pattern 3d formed on an inner peripheral surface of the holding aperture 20. Similarly, owing to the transversal side portion 21b of the contact terminal 21 serving as a terminal 16 is contacted on the back face of the base member 2, the contact terminal 21 is fixed on the base member 2, and the transversal side portion 21b is electrically connected to the conductive pattern 3e formed in neighborhood of an edge in width direction on the back face portion 11 of the base member 2.

In the constitutional example shown in FIG. 6, the electric connection of the contact terminal 21 with the conductive pattern 3 and the mechanical connection of the contact terminal 21 and the base member 2 are performed by merely press fitting the longitudinal side portion 21a of the contact terminal 21 into the holding aperture 20. In other words, since the contact terminal 21 and the conductive pattern 3 are not fixed by soldering, it is possible to prevent the flaking of the conductive pattern 3 from the base member 2 due to pressure received from the contact terminal portion 7 of the socket 6. Furthermore, since the contact terminal 21 having a substantially L-shaped section is used as a contact 8 for electrically connecting the contact terminal portion 7 of the socket as the counterpart connector with the base member 2, durability of the contact body 8 is increased.

Figure 7:
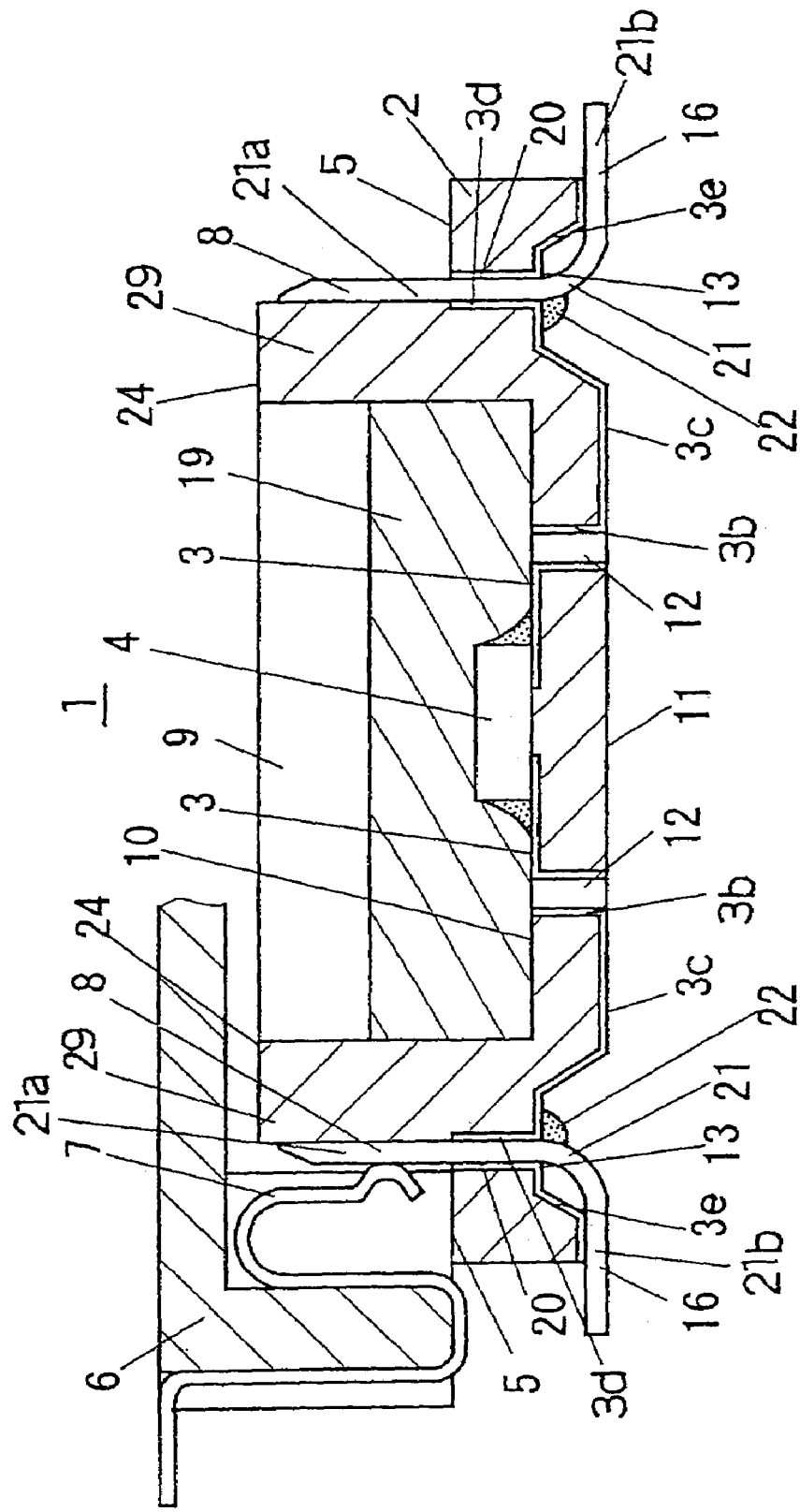
FIG. 7 is a sectional view showing a configuration of a modification of the connector in accordance with the second embodiment.

Subsequently, a configuration of a modification of the connector in accordance with the second embodiment is shown in FIG. 7. As shown in FIG. 7, it is possible that the contact terminal 21 and the conductive pattern 3 are soldered in the groove portion 13 (soldered portion is designated by a numeric symbol 22) for electrically connecting and mechanically fixing the contact terminal 21 with the conductive pattern 3.

According to this modification, the contact terminal 21 and the conductive pattern 3 are fixed by soldering. However, the direction of press fitting of the contact terminal 21 into the holding aperture 20 of the base member 2 is set to be perpendicular to the direction of pressure received from the contact terminal portion 7 of the socket 6, so that it is possible to reduce the load due to the contact pressure to the soldered portion 22 of the contact terminal 21 and the conductive pattern 3, and it is possible to prevent the flaking of the conductive pattern 3 from the base member 2 due to the load.

In addition, it is possible to use conductive paste for electrically connecting the contact terminal 21 and the conductive pattern 3. Furthermore, it is possible to fill the sealant 19 into the cavity 9 so that the electronic component 4 is covered and sealed by the sealant 19.

Figure 8:
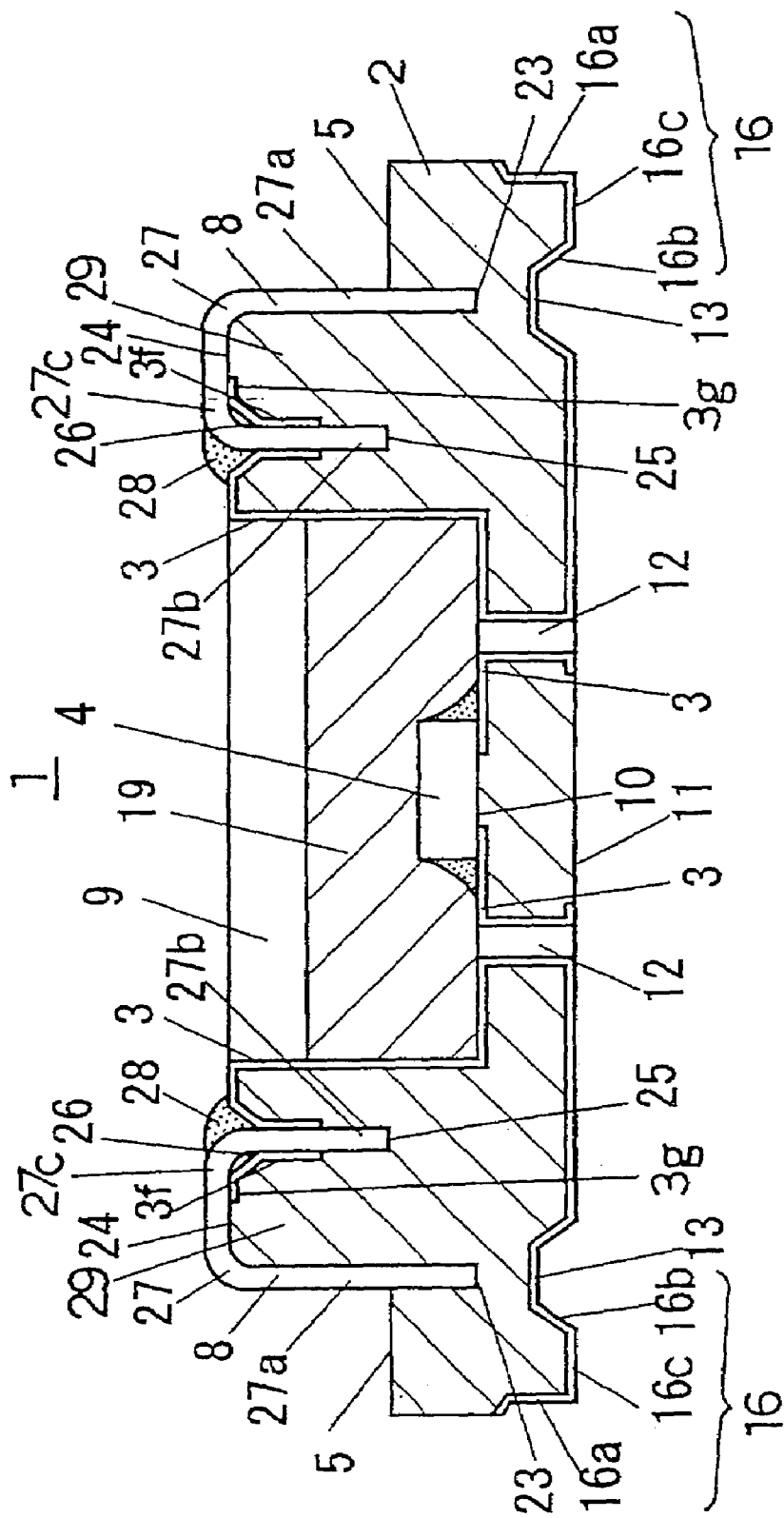
FIG. 8 is a sectional view showing a configuration of a connector with an electronic component built-in in accordance with a third embodiment of the present invention.
Figure 9A:
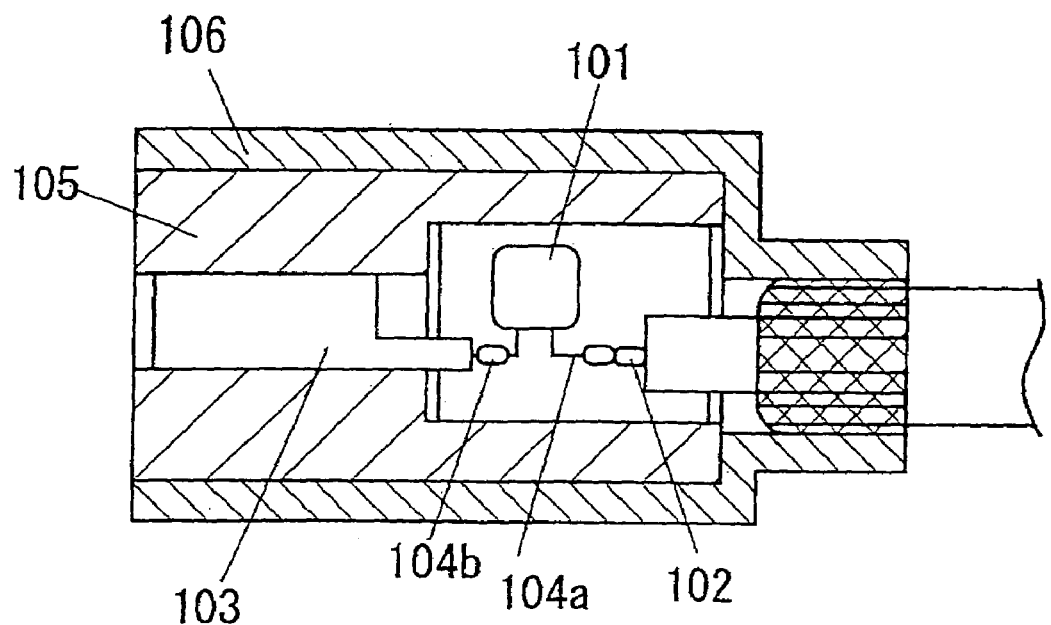
Figure 9B:
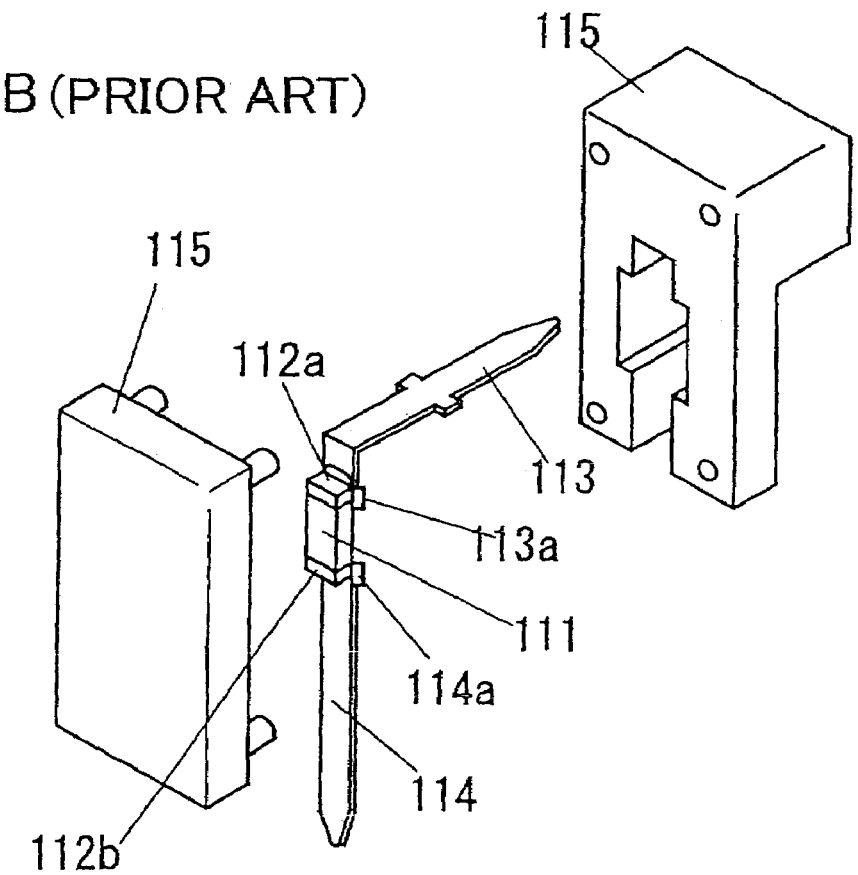

Subsequently, a connector with an electronic component built-in in accordance with a third embodiment of the present invention is described in detail with reference to the figures. FIG. 8 is a sectional view showing a configuration of a header in of a connector in accordance with the third embodiment.

As shown in FIG. 8, press fitting apertures 23 each for holding a longer longitudinal side portion 27a of a contact terminal 27 made of a metal are formed on the plane portion 5 of the base member 2 along outer side faces of the fitting portion 29, in the third embodiment. Furthermore, holding apertures 25 each for folding a shorter longitudinal side portion 27b of the contact terminal 27 are formed on upper faces 24 of the fitting portions 29 in directions perpendicular to a direction of contacting with the socket 6 as the counterpart connector. An open end 26 of the holding aperture 25 is formed so that a width of the open end 26 becomes gradually wider toward outside. Still furthermore, a conductive pattern 3f is formed on an inner peripheral surface of the holding aperture 25.

The contact terminal 27 is a metal band formed substantially U-shape having the longer longitudinal side portion 27a, the shorter longitudinal side portion 27b and a transversal side portion 27c, and the longer longitudinal side portion 27a serves as a contact 8. The contact terminal 27 is held on the base member 2 in a manner so that the longer longitudinal side portion 27a is press fitted into the press fitting aperture 23 and the shorter longitudinal side portion 27b is press fitted into the holding aperture 25 from above the base member 2. A neighboring portion of a free end of the longer longitudinal side portion 27a and a neighboring portion of a free end of the shorter longitudinal side portion 27b respectively serve as portions to be held which are press fitted into the press fitting aperture 23 and the holding aperture 25.

When the contact terminal 27 is held on the base member 2, the shorter longitudinal side portion 27b is connected to the conductive pattern 3f formed on the inner peripheral surface of the holding aperture 25, and the transversal side portion 27c is contacted with a conductive pattern 3g formed on the upper face 24 of the fitting portion 29 of the base member 2. Furthermore, the contact terminal 27 and the conductive pattern 3 are soldered (soldered portion is designated by a numeric symbol 28) for electrically connecting and mechanically fixing the contact terminal 27 with the conductive pattern 3. As a result, the longer longitudinal side portion 27a of the contact terminal 27 along an outer side face of the fitting portion 29 of the base member 2 serves as a contact 8.

Besides, it is not necessarily soldered for electrically connecting and mechanically fixing the contact terminal 27 and the conductive pattern 3, but it is possible that the contact terminal 27 is simply press fitted into the holding aperture 25. Alternatively, a conductive paste can be used in substitution for soldering. Furthermore, it is possible to fill the sealant 19 into the cavity 9 so that the electronic component 4 is covered and sealed by the sealant 19.

According to the third embodiment, since the contact terminal 27 is used as a contact 8 which is electrically connected to the contact terminal portion 7 of the socket 6 which is a counterpart connector, durability of the contact 8 is increased. Furthermore, since the direction for press fitting the contact terminal 27 into the base member 2 is to be perpendicular to the direction of the contact pressure received from the socket 6, it is possible to reduce the load to the soldered portion 28 of the contact terminal 27 and the conductive pattern 3 due to the contact pressure, and it is possible to prevent the flaking of the conductive pattern 3 from the base member 2 due to the load.

In addition, the present invention is not limited to the connector used for the mother board as mentioned in each above embodiment. For example, it can be used for a connector connected to an interface cable provided on a mobile phone or a PDA (Personal Digital Assistant).

Furthermore, the connector with an electronic component built-in is not limited to the header constituting the connector as mentioned in each above embodiment. For example, the electronic component may be built-in an interior of the socket which is a counterpart connector of the header.

The present application is based on Japan patent Application No. 2003-301913, the contents of which are hereby incorporated by references.

Although the present invention has been fully described by way of example with reference to the accompanying drawings, it is to be understood that various changes and modifications will be apparent to those skilled in the art. Therefore, unless otherwise such changes and modifications depart from the scope of the present invention, they should be construed as being included therein.

The invention claimed is:

1. A connector with an electronic component built-in comprising:
   a base member formed of a three-dimensional formation circuit board;
   terminals formed on said base member and electrically connected to wiring pattern of a mother board;
   a fitting portion formed on said base member, and to be fitted to a counterpart connector;
   contacts arranged on said fitting portion and to be electrically connected with contacting terminal portions of said counterpart connector;
   an electric component disposed on said base member; and
   a conductive pattern formed on said base member for electrically connecting said terminals or said contacts with said electronic component.

2. The connector in accordance with claim 1, wherein said contact is integrally formed with conductive pattern formed on said base member.

3. The connector in accordance with claim 1, wherein said contact is constituted by a contact terminal made of a metal and disposed on said fitting portion of said base member.

4. The connector in accordance with claim 3, wherein holding apertures each for holding said contact terminal are formed on said base member in a direction perpendicular to a direction of press contact of contact terminals of a counterpart connector;

said contact terminal has a portion serving as a contact disposed along an outer side face of said fitting portion, and a portion to be held which is extended from said portion serving as a contact and is press fitted into and held by said holding aperture; and said conductive pattern connected to the portion to be held of said contact terminal which is press fitted into and held on said holding aperture is formed on an inner peripheral surface of said holding aperture.

5. The connector in accordance with claim 1, wherein said terminal is integrally formed with a conductive pattern formed on said base member.

6. The connector in accordance with claim 5, wherein said conductive pattern is formed across a fixing face of said base member to be fixed on said mother board and a plane which is not in parallel with said fixing face of said base member.

7. The connector in accordance with claim 1, wherein said base member has a cavity in which said electronic component is mounted.

8. The connector in accordance with claim 7, wherein a sealant is filled in said cavity.

* * * * *